(12) United States Patent
Yagai et al.

(10) Patent No.: US 6,315,501 B1
(45) Date of Patent: Nov. 13, 2001

(54) AIR STREAM PARTICULATE COLLECTING TRANSFER APPARATUS

(75) Inventors: Michio Yagai, Tokyo; Masayuki Toda, Yamagata-ken; Masaru Umeda, Tokyo, all of (JP)

(73) Assignee: Kabushiki Kaisha Watanabe Shoko, Tokyo (JP)

( * ) Notice: Subject to any disclaimer, the term of this patent is extended or adjusted under 35 U.S.C. 154(b) by 0 days.

(21) Appl. No.: 09/403,380
(22) PCT Filed: Apr. 24, 1998
(86) PCT No.: PCT/JP98/01913
  § 371 Date: Dec. 27, 1999
  § 102(e) Date: Dec. 27, 1999
(87) PCT Pub. No.: WO98/47798
  PCT Pub. Date: Oct. 29, 1998

(30) Foreign Application Priority Data

Apr. 24, 1997 (JP) .................................................. 9/107935

(51) Int. Cl.⁷ ...................................................... B65G 51/00
(52) U.S. Cl. .............................. 406/198; 406/191; 406/88
(58) Field of Search ................................ 406/86, 88, 191, 406/193, 194, 195, 198

(56) References Cited

FOREIGN PATENT DOCUMENTS

| | | | |
|---|---|---|---|
| 62-21623 A | 1/1987 | (JP) | ................................ B65G/51/03 |
| 52-124679 | 10/1977 | (JP) | ................................ B65G/7/06 |
| 09219432 A | 8/1997 | (JP) | ................................ H01L/21/68 |

*Primary Examiner*—Christopher P. Ellis
*Assistant Examiner*—Joe Dillon, Jr.
(74) *Attorney, Agent, or Firm*—Randall J. Knuth

(57) ABSTRACT

An air stream transfer apparatus capable of preventing particles in a transfer passage from adhering to an object to be processed and removing the particles. The apparatus includes that of a transfer face and a transfer passage partition both constituting a transfer passage, which are made of an electroconductive material and each have a thin insulating layer on the surface. A planer dust collecting electrode is opposed to an object to be processed and mechanism is provided for bringing the dust collecting electrode and the face to be cleared of dust close to each other while jetting air. A mechanism is provided for applying voltages between the transfer face and the dust collecting electrode and between the transfer passage partition and the dust collecting electrode and between the transfer passage partition and the dust collecting electrode. Another apparatus is characterized in that a transfer face and a transfer passage partition both constituting a transfer passage are made of an electroconductive material and each has a thin insulating layer on the surface. A mechanism for transferring a pre-charged semiconductive plate-shaped body along the transfer passage is provided, and the semiconductive plate-shaped body used as a dust collecting electrode.

11 Claims, 6 Drawing Sheets

400 x 400
x 0.8t (mm)
790 (g)

400 x 200
x 0.8t (mm)
604 (g)

400 ⌀ x 0.8t (mm)
813 (g)

300 ⌀ x 0.8t (mm)
583 (g)

400 x 400
x 0.8t (mm)
702 (g)

400 x 200
x 0.8t (mm)
379 (g)

400⌀ x 0.8t (mm)
524 (g)

300⌀ x 0.8t (mm)
380 (g)

400⌀ x 0.8t (mm)
679 (g)

400⌀ x 0.8t (mm)
703 (g)

400⌀ x 0.8t (mm)
586 (g)

400⌀ x 0.8t (mm)

AIR STREAM PARTICULATE COLLECTING TRANSFER APPARATUS

TECHNICAL FIELD

The present invention relates to a particle collecting apparatus which is employed in a transfer apparatus for transferring an object to be processed afloat within a transfer passage by means of an air stream, and particularly in an air stream transfer apparatus for transferring semiconductor wafers in a semiconductor manufacturing apparatus.

BACKGROUND ART

In semiconductor manufacturing apparatuses, transfer apparatuses are employed in order to transfer the semiconductor wafers between the processing apparatuses. Standard transfer apparatuses of this type are transfer apparatuses in which the semiconductor wafer cassette jig is loaded on a transfer carriage, and transfer apparatuses in which the semiconductor wafers are transferred one at a time by a robot arm. However, in such transfer apparatuses, the atmosphere of the space in which the semiconductor wafers are processed is not separated from the outside atmosphere, and the atmosphere of this space is not sufficiently clean. Recently, methods have been employed in which the semiconductor wafer cassette jig is placed in a sealed container for transfer; however, the problems of contamination from the container materials and the air tight gaskets and the like has not been solved.

For this reason, air stream transfer apparatuses which transfer semiconductor wafers through a transfer passage by means of an air stream (air bearing) have been experimentally produced, and such air stream transfer apparatuses enable a closed type (closed system) transfer passage, so that it is possible to attain a sufficiently high level of cleanliness in the atmosphere.

However, in the air stream transfer apparatuses, even if the structure is such as to contain no parts which give rise to contamination within the apparatus, so that a clean space may be maintained, there may be cases in which particles which have been brought in from the outside, for example, particles which have been deposited on the semiconductor wafers, are released within the apparatus.

Such particles present a problem in that they are then deposited on other clean semiconductor wafers. Additionally, in concert with the miniaturization and increase in functionality of the semiconductor integrated circuits and the like which are formed on these semiconductor wafers, the situation is such that, increasingly, almost no contamination or deposition of matter can be tolerated, so that this problem is important in view of an increase in the reliability of the semiconductor manufacturing apparatus and in the productivity (yield) of the semiconductor wafers.

The present invention was created in order to solve the problems described above; it has as an object thereof to provide a particle removing apparatus which is capable of preventing the deposition of particles on objects to be processed within a transfer passage.

DISCLOSURE OF THE INVENTION

The air stream transfer apparatus of the present invention is an air stream transfer apparatus for transferring an object to be processed by means of an air stream, characterized in that a transfer face and a transfer passage partition, which are faces to be cleared of dust and which together constitute a transfer passage, are made of an electroconductive material and each have a thin insulating layer on the surface thereof; a planar dust collecting electrode is opposed to an object to be processed; a mechanism is provided for bringing the dust collecting electrode and the faces to be cleared of dust close to each other while jetting air; and a mechanism is provided for applying voltages between the transfer face and the dust collecting electrode and between the transfer passage partition and the dust collecting electrode.

It is preferable that a semiconductor material having a surface resistivity within a range of $5 \times 10^5 - 10^8$ Ω·cm in the shape of a plate-shaped body or a film be employed as the dust collecting electrode described above.

It is preferable that the distance between the dust collecting electrode described above and the transfer face which is to be cleared of dust, and between the dust collecting electrode and the transfer passage partition which is to be cleared of dust, be less than 2.0 mm. A distance within a range of 0.2–0.5 mm is more preferable.

It is preferable that a circuit be provided which generates an electrical field between the transfer face, the transfer passage partition, and the dust collecting electrode described above, and that a power source apparatus be provided which is capable of selectively switching between a positive and negative applied electrical field.

It is preferable that the amount of air jetted during the removal of particles be made variable, so as to maintain the insulation by adjusting the very small gap between the dust collecting electrode and transfer face and transfer passage partition by means of an air layer.

An air stream transfer apparatus of the present invention is an air stream transfer apparatus for conveying objects to be processed by means of an air stream, characterized in that a transfer face and a transfer passage partition, which are faces to be cleared of dust and which together constitute a transfer passage, are made of an electroconductive material and each has a thin insulating layer on the surface; a mechanism for transferring a pre-charged semiconductive plate-shaped body afloat along the transfer passage is provided, and a semiconductive plate-shaped body is used as the dust collecting electrode.

The particles which enter into the apparatus are affected by various forces, such as gravity, Brownian motion, inertial motion, static electric force, Brownian dispersion, vander Waals forces, and the like, and are deposited on the transfer face and the transfer passage partition. If the particle size is one micrometer or less, it becomes extremely difficult to remove such particles under dry processing conditions while maintaining a highly clean atmosphere. Among methods for such removal while maintaining a highly clean atmosphere, electrostatic force (Coulomb force) is the most powerful; however, experimental results show that such removal is difficult, irrespective of the particle material (good conductors such as metals or the like, semiconductors, non-conductors, or resins).

In order to remove particles using electrostatic force, it is necessary to weaken the force of adhesion in advance and to make the particles easily charged by electrostatic induction.

As a result of experimentation, it has been determined that by employing conductive materials having thin oxide film insulating layers formed thereon, and by applying an electric field to the particles on the surface of the insulating layers, removal by means of electrostatic force is facilitated. In such a case, it is thought that the various forces acting on the particles which are described above are weakened.

Examples of conductive materials having insulating layers formed thereon which are capable of maintaining a highly clean atmosphere include, for example, those in which $Al_2O_3$ is formed on the surface of highly pure aluminum or an aluminum alloy material, which avoids heavy metal contamination and involves little release of moisture or other gases, and those in which $Cr_2O_3$ is formed in a thickness within a range of 5–10 micrometers on the surface of stainless steel SUS316L. Nitrides are acceptable in place of oxides.

Among insulating materials, those with high dielectric constants are polarized by electric fields and interfere with the release of particles, and further weaken the Coulomb force, so that dielectric substances are not appropriate.

When particles are captured at the dust collecting electrode by electrostatic force, those particles having a resistivity of less than $10^5$ $\Omega\cdot cm$ lose their charge, and an electrostatic attractive force in the opposite direction acts on these particles by electrostatic induction from the electrical field and they move in the direction of the transfer face and transfer passage partition, and recharging and recapturing is repeated, so that so-called induction reentrainment occurs.

Using particles of pure aluminum (A1100), this was increasingly likely to occur as the surface resistance of the dust collecting electrode decreased, or as the particle size increased. It was determined that by using a dielectric plate having a surface resistance of $10^8$ $\Omega\cdot cm$ as the dust collecting electrode, the redispersion of conductive particles of 20 micrometers or less could be prevented. This is thought to result from a delay in the charge neutralization of the particles, or from the supportive effect of vander Waals forces once small particles have been captured.

The insulating layer type particles described above are the same as non-conducting ones irrespective of the type of material, and in order to charge these using electrostatic induction and collect them, it is effective to bring the dust collecting electrode and the transfer face and transfer passage partition into close proximity. Experimental results show that by setting the distance to 2.0 mm or less, and more preferably to within a range of 0.2 mm–0.5 mm, and by setting the applied voltage within a range of 1 kV–2.5 V, it is possible to collect particles of one micrometer or less.

The particle collecting method of the air stream transfer apparatus of the present invention described in claim 6 will now be explained.

In the present invention, the transfer face and the transfer passage partition are made of an electroconductive material and each have a thin insulating layer on the surface thereof, and a mechanism is provided for transferring a semiconductive plate-shaped body afloat along a transfer passage formed by the transfer face and the transfer passage partition, and this semiconductive plate-shaped body is transferred through the transfer passage afloat as the dust collecting electrode. The cleaning of the interior of the apparatus may be conducted by providing the semiconductive plate-shaped body used for the dust collecting electrode with a positive or negative charge in advance with respect to the transfer face and transfer passage partition, placing this within the apparatus in place of the object to be processed, transferring the plate-shaped body afloat at a height of less than 2 mm, and preferably at a height within a range of 0.2–0.5 mm, completely capturing the particles, and recovering this electrode once it has exited the transfer apparatus.

In such a case, it is possible to reliably adsorb particles whether they are positively or negatively charged. Furthermore, by increasing the jet gas flow rate from jet hole 4, thus increasing the float height of the plate-shaped body, and conducting transfer in the vicinity of the transfer passage upper part (ceiling part) 1*b*, this may be cleaned, and simultaneously, the cleaning of the particles in the space within the transfer passage and floating in the air stream is conducted.

The various bodies shown in FIG. 5 may be employed as the semiconductive plate-shaped body. In FIG. 5, the white portions indicate plate-shaped bodies comprising a semiconductive material having a resistance of $5\times10^5$–$10^8$ $\Omega\cdot cm$, while the parts which are cross-hatched indicate ferroelectric charge parts which are formed on the plate-shaped body comprising a semiconductive material.

The dead weight and electrostatic attraction force of A–K are as given below.

TABLE 1

|   | Dimensions (mm) | Deadweight (gf) | Electrostatic attractive force (gf) | Total (gf) |
|---|---|---|---|---|
| A | 400 × 400 × 0.8t | 307 | 790 | 1097 |
| B | 400 × 200 × 0.8t | 154 | 450 | 604 |
| C | 400φ × 0.8t | 192 | 620 | 813 |
| D | 300φ × 0.8t | 136 | 447 | 583 |
| E | 400 × 400 × 0.8t | 307 | 395 | 702 |
| F | 400 × 200 × 0.8t | 154 | 225 | 379 |
| G | 400φ × 0.8t | 192 | 332 | 524 |
| H | 300φ × 0.8t | 136 | 244 | 380 |
| I | 400φ × 0.8t | 192 | 487 | 679 |
| J | 400φ × 0.8t | 192 | 511 | 703 |
| K | 400φ × 0.8t | 192 | 394 | 586 |

The specific gravity was calculated to be 2.4.

A circuit which generates an electrical field between the dust collecting electrode and the transfer face and transfer passage partition, and a power source apparatus which is capable of freely switching the positive and negative polarity of the electrical field applied, are provided, and during cleaning, a voltage is applied to the apparatus, and an electrical field is generated.

During transfer of the object to be processed, the dust collecting electrode is connected to the same potential as the transfer face and transfer partition, so that electrostatic interference does not extend to the object to be processed.

During the removal of particles, the very small gap between the dust collecting electrode and the transfer face and transfer passage partition is maintained, so that by making the air stream from the jet holes variable, and by means of the air layer produced in the very small gap, the insulation can be maintained. This is particularly effective when a film is used as the dust collecting electrode.

BRIEF DESCRIPTION OF THE DIAGRAMS

DESCRIPTION OF THE REFERENCES 1 air stream transfer apparatus main body,
2 dust collecting electrode storage roller,
3 dust collecting electrode,
4 gas jet hole,
5 object to be processed,
6 height microadjustment apparatus,
7 bellows style contracting body,
8 power source for electrical field generation,
9 short circuit switch,
10 positive/negative switch,
11 exhaust,
12 exhaust,
13 roller grove.

BEST MODE FOR CARRYING OUT THE INVENTION

Figure 1:
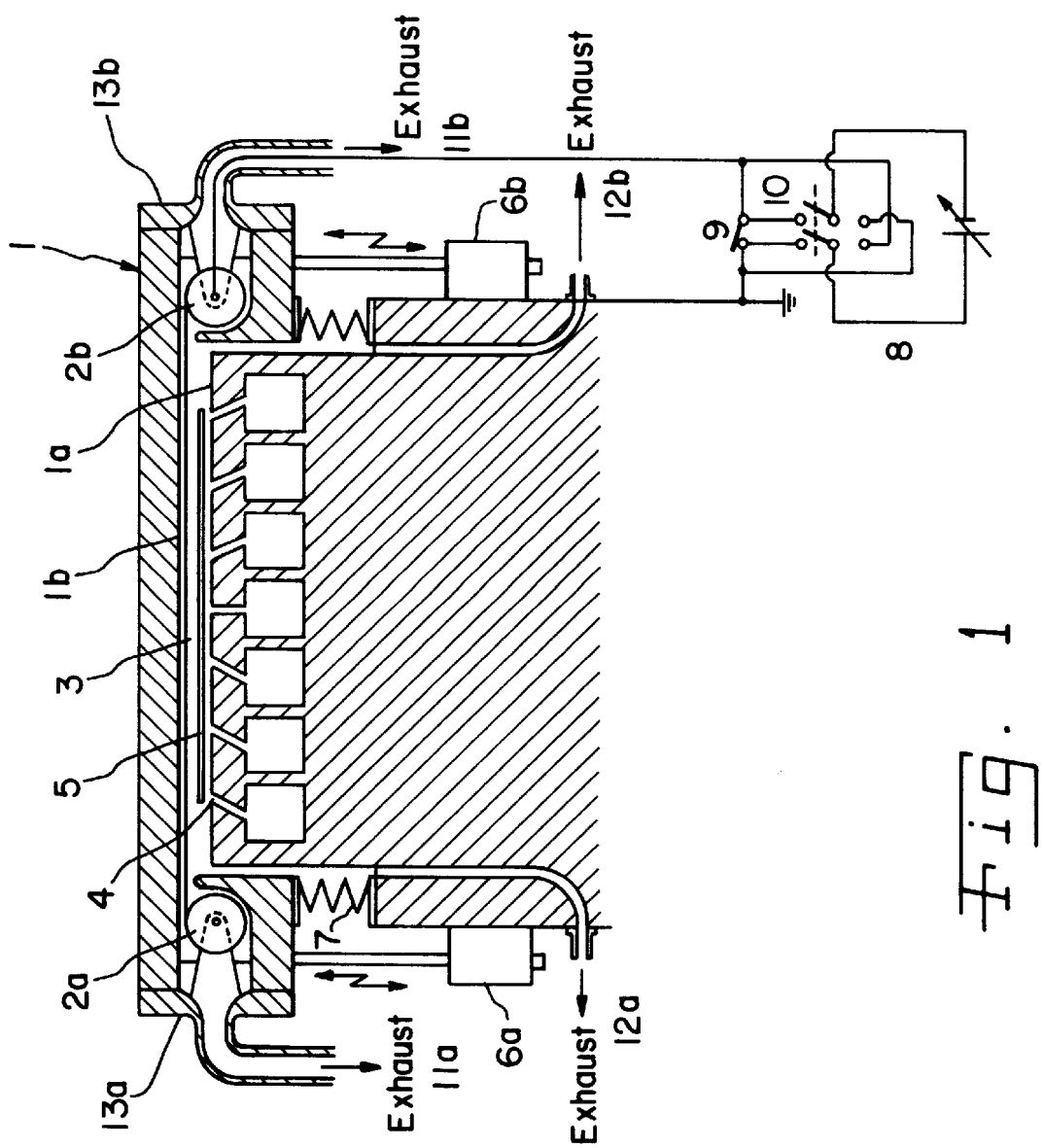
FIG. 1 is a schematic cross-sectional view during the transfer of an object to be processed in an air stream transfer apparatus which is provided with a dust collecting electrode in accordance with the present invention.
Figure 2:
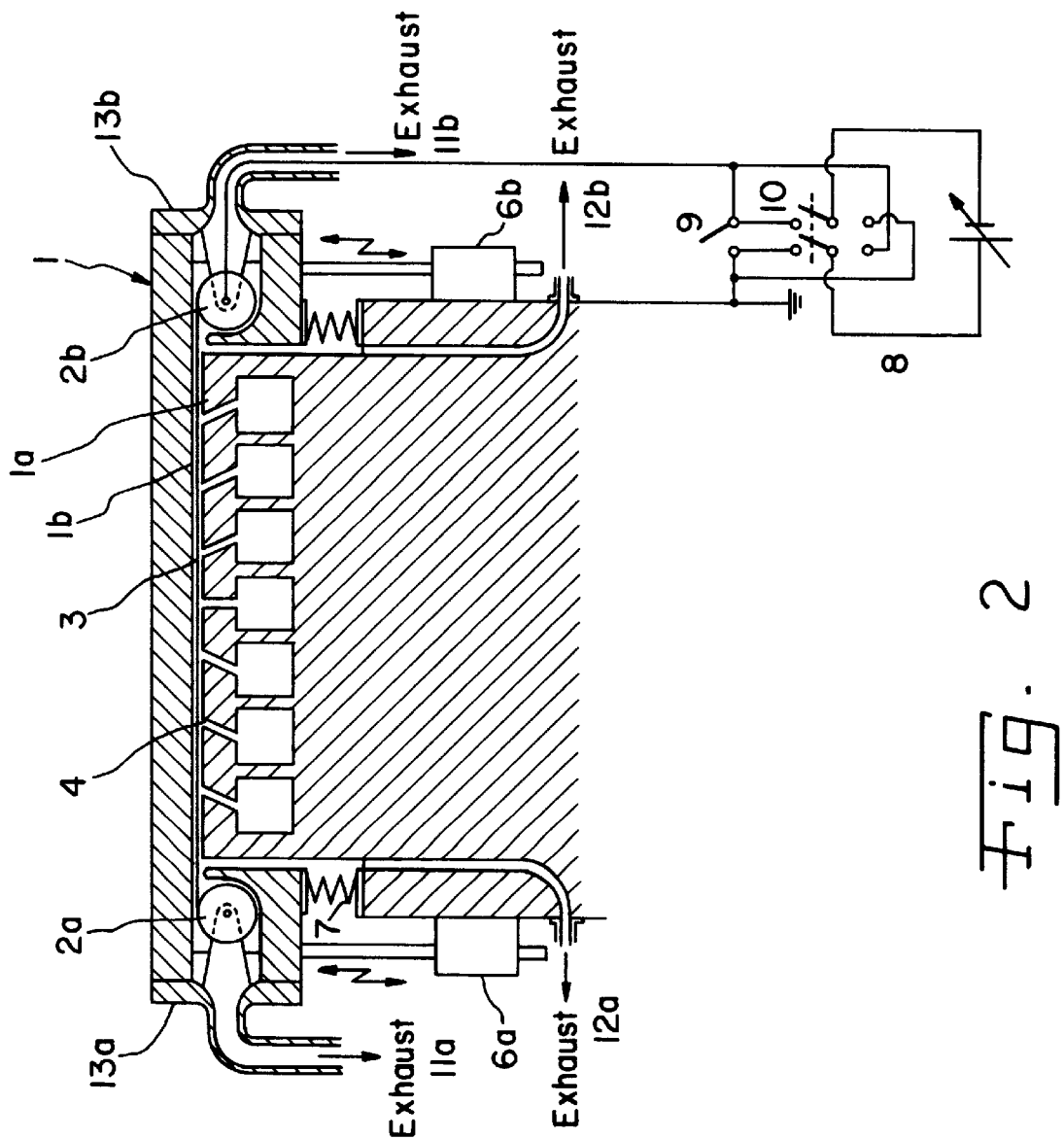
FIG. 2 is a schematic cross-sectional view during cleaning within the transfer passage in an air stream transfer apparatus which is provided with a dust collecting electrode in accordance with the present invention.

FIGS. 1 and 2 are structural cross-sectional views showing an air stream transfer apparatus which is provided with a particle collecting apparatus in accordance with the present invention.

Figure 3:
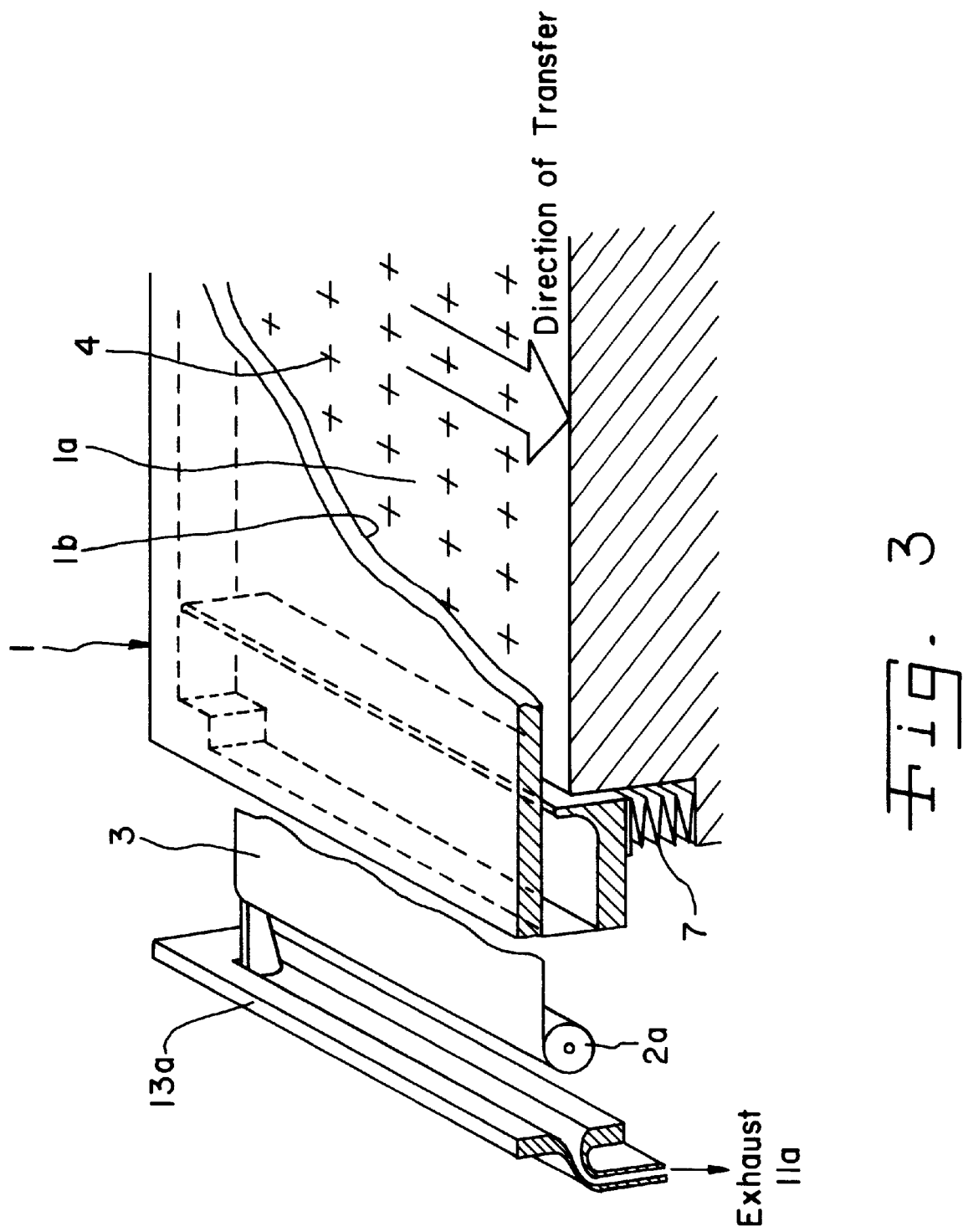
FIG. 3 is a schematic cross-sectional view showing a part of the dust collecting electrode and the transfer face of an air stream transfer apparatus in accordance with the present invention.

Furthermore, FIG. 3 is a cross-sectional perspective view showing an air stream transfer apparatus which is provided with a particle collecting apparatus in accordance with the present invention.

In FIG. 1, a transfer passage 1 is formed by transfer face 1a and transfer passage upper partition (ceiling face) 1b at the inner surface of the air stream transfer apparatus transfer passage 1, and this transfer passage 1 is a sealed space which is isolated from the outside atmosphere.

A plurality of gas jet holes 4 are provided in transfer face 1a, and gas jet holes 4 are connected with a jet gas supply source for $N_2$ gas or the like (not shown in the figure), and a film-shaped dust collecting electrode 3 which is in the vicinity of the transfer passage upper partition 1b extends between takeup rollers 2a and 2b, and is connected to a power source for electrical field generation 8 via roller 2a. Furthermore, a structural body 7 which is capable of contracting in the manner of a bellows is provided between transfer face 1a and transfer passage partition 1b, and by means of height microadjustment apparatuses 6a and 6b, the gap between transfer passage partition 1b and dust collecting electrode 3 and the transfer face may be adjusted.

In this air stream transfer apparatus, as shown in FIG. 1, in a state in which the switch 10 within the power circuit is opened, and switch 9 is closed, and the dust collecting electrode is connected to transfer passage 1, and an object to be processed (semiconductor wafer or the like) 5 is introduced in the transfer passage, this is transferred floating at a height within a range of 0.2–0.5 mm by means of the highly pure $N_2$ gas or the like from the jet holes 4, After the jet gas has filled the transfer passage, it is exhausted from exhaust holes 10a, 10b, 11a, and 11b. The amount exhausted is set so as to maintain a balance with the total amount of jet gas. The above is the normal transfer.

(Dust Collection Operation)

FIG. 2 shows the state within the apparatus during cleaning when the transfer of objects to be processed has been interrupted. Height microadjustment apparatuses 6a and 6b are operating, and transfer passage partition 1 and dust collecting electrode 3 are lowered and approach transfer face 1a, an air stream is jetted from jet holes 4, and an air layer is formed between the dust collecting electrode and the transfer face, so that insulation is maintained in a very small gap.

Next, when switch 9 of power source circuit 12 is opened, and switch 10 is closed, a voltage is applied between dust collecting electrode 3 and transfer face 1a and transfer passage partition 1b. As described above, the surfaces from which particles are to be removed are insulating layers and the particles are in a state in which they float from the base metal of transfer face 1a and transfer passage partition 1b, so that all forces acting thereon are weakened, and it is easily possible to separate these particles from transfer face 1a and transfer passage partition 1b by means of electrostatic force, and to deposit these on dust collecting electrode 3, Dust collecting electrode 3 has a high surface resistivity, so that induction reentrainment is prevented and the particles can be reliably captured. Simultaneously, the particles which are free within the transfer passage space are entrained in the air stream from jet holes 4, and repeatedly come into proximity with and contact dust collecting electrode 3, so that these are also captured by dust collecting electrode 3, The dust collecting electrode 3 which has captured particles is taken up on takeup roller 2b, and even if the power source is disconnected from this after the storage of both sides, the particles are not released. Simultaneously with the take up, further dust collection is conducted by means of a fresh dust collecting surface which is supplied from roller 2a.

After the completion of dust collection, the switch 10 of the power source circuit is opened, and the switch 9 is closed, so that the charge of the dust collecting electrode is neutralized and the electrostatic interference having an effect on the objects to be processed is removed. Next, the height microadjustment apparatuses 6a and 6b (the mechanisms which serve to bring the dust collecting electrode and surfaces from which dust is to be removed into proximity) are operated, and the transfer passage partition 1 and the dust collecting electrode 3 are lifted to the standard transfer positions, and the air stream transfer of objects to be processed is conducted.

Dust collection is repeated for a certain period, and when the dust collecting film approaches its end, as shown in FIG. 3, the highly clean gas pressure within transfer passage 1 is maintained at a positive pressure with respect to the pressure outside the apparatus, roller frame groove 13a is removed, and the end part of roller 2a is connected to the spare dust collecting electrode roller foil and exchanged, and then the new, clean film is fed in. On the other hand, the roller 2b which has collected particles is exchanged in a similar manner, and the particles are removed in the state in which they are stored on the roller which has collected dust.

Figure 4:
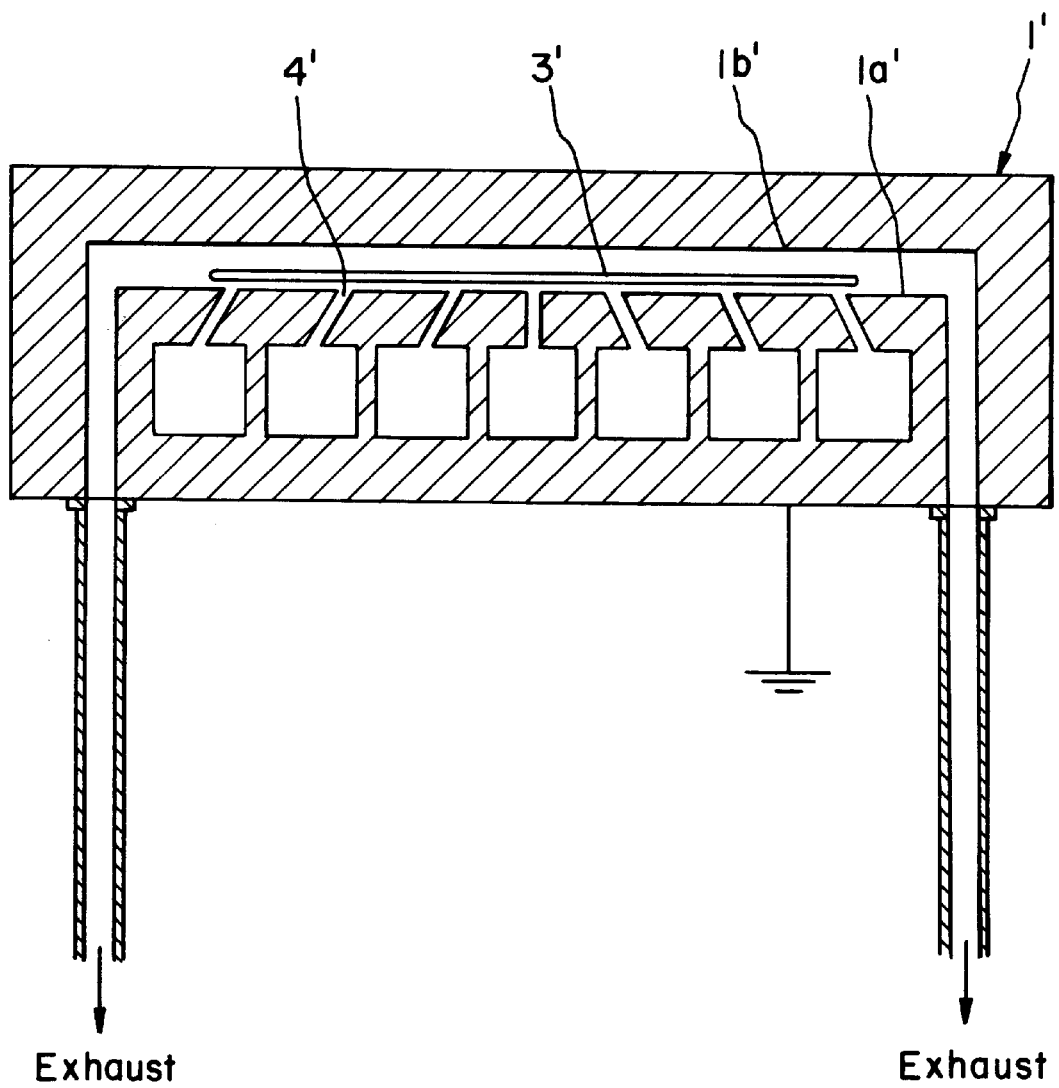
FIG. 4 is a schematic cross-sectional view showing the particle collecting method in another air stream transfer apparatus in accordance with the present invention.
Figure 5A:
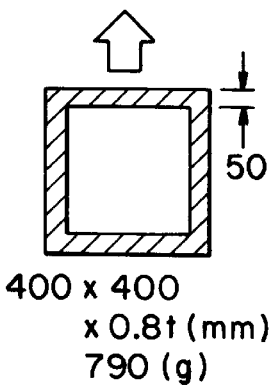
FIG. 5 is a top view of the semiconductive plate-shaped body.
Figure 5B:
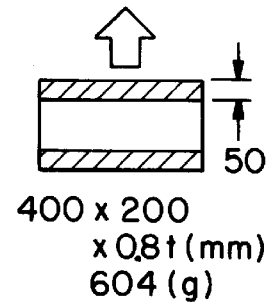
Figure 5C:
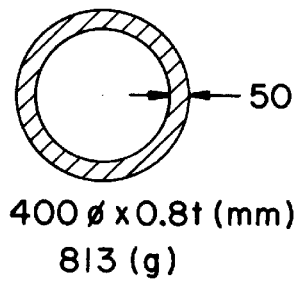
Figure 5D:
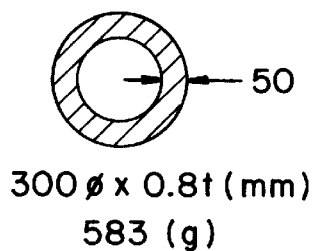
Figure 5E:
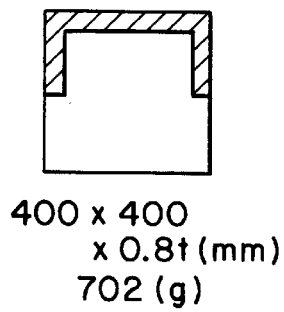
Figure 5F:
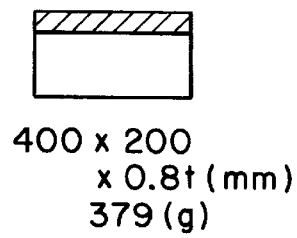
Figure 5G:
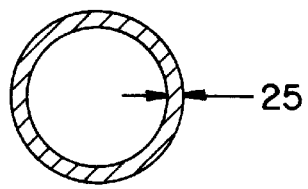
Figure 5H:
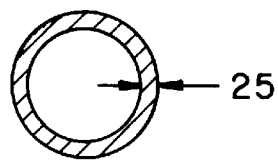
Figure 5I:
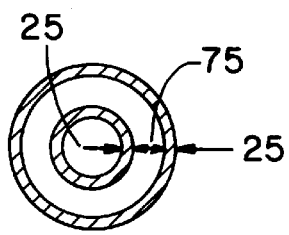
Figure 5J:
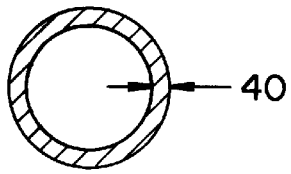
Figure 5K:
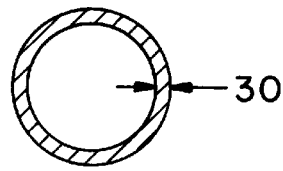
Figure 5L:
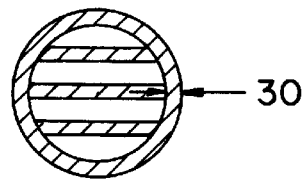

FIG. 4 is a cross-sectional view showing the particle collecting method in another air stream transfer apparatus in accordance with the present invention.

The transfer face 1a' and the transfer passage partition 1b' of the transfer apparatus 1' are made of electroconductive materials and have a thin insulating film formed on the surface thereof, and a plate-shaped body 3' which is made from a semiconductive material having a surface resistivity within a range of $5 \times 10^5 - 10^8$ Ω·cm is transferred in a floating manner as the dust collecting electrode.

In order to transfer the semiconductive plate-shaped body in a floating manner, as is the case in the floating transfer of the objects to be processed, an air stream may be jetted from the bottom surface. Accordingly, the mechanism for transferring the objects to be processed in a floating manner is used as the mechanism for transferring the semiconductive plate-shaped body in a floating manner.

A plurality of semiconductive plate-shaped bodies 3' for use as dust collecting electrodes is prepared, and these are introduced into the apparatus 1' in place of the objects to be processed 5 in a state in which they are pre-charged with a positive or negative charge with respect to transfer face 1a' and transfer passage partition 1b', and are transferred in a floating manner at a height of 2 mm or less above the transfer face, and preferably at a height within a range of 0.2–0.5 mm.

The particles of transfer face 1a' may be easily collected in the same manner as the collection conditions described above, and the semiconductive plate-shaped body 3' used for the dust collection electrode may be recovered once it has exited the transfer apparatus 1'.

The cleaning of the apparatus 1' may be conducted by transferring a number of such electrodes successively. Furthermore, positively or negatively charged dust collecting plate-shaped bodies 3' may be transferred, so that both positively and negatively charged particles may be reliably collected, and furthermore, by increasing the float height of the dust collecting plate-shaped body 3' by increasing the jet gas air stream from the jet holes 4', and transferring the electrodes in the vicinity of the transfer passage partition 1b', this may also be cleaned, and the cleaning may be conducted with respect to the particles which are in the space within the transfer passage and which are free in the air stream.

A mechanism for causing the dust collecting electrode face and the faces from which dust is to be removed shown in FIG. 1 to approach one another may be provided.

In the present example, the structures within the transfer passage are extremely simple, so that there are no parts which give rise to dust.

In the embodied mode described above, the explanation centered on the case in which the objects to be processed were semiconductor wafers; however, the present invention may also be applied to air stream transfer apparatuses which transfer other objects to be processed, such as glass substrates and the like.

Furthermore, in the present example the explanation centered on a particle collecting apparatus in an air stream transfer apparatus; however, the present invention is also applicable to the removal of particles deposited on partition faces of various semiconductor manufacturing apparatuses.

Standard pressure may be employed within the transfer passage, or the pressure may be reduced below 400 Torr, and may be reduced as far as 50 Torr. Even under such low pressures, it is possible to transfer the objects to be processed or the semiconductive plate-shaped body in a floating manner.

INDUSTRIAL APPLICABILITY

In the air stream transfer apparatus provided with the dust collecting apparatus shown in FIGS. 1, 2, and 3, it is possible to conduct a dust collection operation without opening the transfer passage to the outside atmosphere, and it is possible to reliably remove particles within the apparatus, so that particles within the transfer passage are not deposited on the object to be processed.

Furthermore, when the air stream transfer apparatus having the structure shown in FIG. 4 is employed, and a semiconductive plate-shaped body which is pre-charged is employed as the dust collecting electrode, and this is transferred in a floating manner in place of the objects to be processed, it is possible to conduct the cleaning of the inside of the apparatus in a non-periodic manner without adding any operations to the apparatus and without exposing the transfer passage to the external atmosphere.

The transfer apparatus also has no moving parts and is an extremely simple static machine, so that there is no generation of dust.

The cleaning of this example can be successively and repeatedly executed using a plurality of plate-shaped bodies for dust collection, and it is possible to apply this to particles having either positive or negative charge, so that the particles within the transfer passage will not be deposited on the objects to be processed.

What is claimed is:

1. An air stream particulate collecting transfer apparatus for transferring objects to be processed in an air stream, said transfer apparatus comprising:

a transfer passage having a transfer face and a transfer passage partition, both with faces to be cleared of dust, both said transfer face and said transfer passage partition made of an electroconductive material, each having a thin insulating layer on a surface;

a planar dust collecting electrode opposed to an object to be processed;

means for moving said dust collecting electrode and said faces to be cleared of dust to each other while jetting air around said object to be processed; and means for applying voltages between said transfer face and said dust collecting electrode and between said transfer passage partition and said dust collecting electrode.

2. An air stream particulate collecting transfer apparatus according to claim 1, further comprising a circuit for generating an applied electric field between both said transfer face and said transfer passage partition and said dust collecting electrode; and a power source apparatus which permits the free switching of the positive and negative polarity of said applied electrical field.

3. An air stream particulate collecting transfer apparatus according to claim 1, wherein said means for moving the amount of air jetted is made variable so as to maintain insulation in a gap between said dust collecting electrode and both said transfer face and said transfer passage partition.

4. An air stream particulate collecting transfer apparatus according to claim 1, in which a distance between said dust collecting electrode and both said transfer face and transfer passage partition, is smaller than 2.0 mm.

5. An air stream particulate collecting transfer apparatus according to claim 4, further comprising a circuit for generating an applied electric field between both said transfer face and said transfer passage partition and said dust collecting electrode; and a power source apparatus which permits the free switching of the positive and negative polarity of said applied electrical field.

6. An air stream particulate collecting transfer apparatus according to claim 4, wherein said means for moving the amount of air jetted is made variable so as to maintain insulation in a gap between said dust collecting electrode and both said transfer face and said transfer passage partition.

7. An air stream particulate collecting transfer apparatus in accordance with claim 1, in which one of a plate body and film of a semiconductive material having a surface resistivity within a range of $5 \times 10^5$ to $5 \times 10^8$ $\Omega \cdot cm$ is employed as said dust collecting electrode.

8. An air stream particulate collecting transfer apparatus according to claim 7, further comprising a circuit for generating an applied electric field between both said transfer face and said transfer passage partition and said dust collecting electrode; and a power source apparatus which permits the free switching of the positive and negative polarity of said applied electrical field.

9. An air stream particulate collecting transfer apparatus according to claim 7, wherein said means for moving the amount of air jetted is made variable so as to maintain insulation in a gap between said dust collecting electrode and both said transfer face and said transfer passage partition.

10. An air stream particulate collecting transfer apparatus according to claim 7, in which a distance between said dust collecting electrode and both said transfer face and transfer passage partition, is smaller than 2.0 mm.

11. An air stream particulate collecting transfer apparatus according to claim 10, wherein said means for moving the amount of air jetted is made variable so as to maintain insulation in a gap between said dust collecting electrode and both said transfer face and said transfer passage partition.

* * * * *